(12) United States Patent
Loopstra et al.

(10) Patent No.: US 8,547,525 B2
(45) Date of Patent: Oct. 1, 2013

(54) EUV RADIATION GENERATION APPARATUS

(75) Inventors: Erik Roelof Loopstra, Eindhoven (NL); Gerardus Hubertus Petrus Maria Swinkels, Eindhoven (NL); Uwe Bruno Heini Stamm, Goettingen (DE)

(73) Assignee: ASML Netherlands B.V., Veldhoven (NL)

( * ) Notice: Subject to any disclaimer, the term of this patent is extended or adjusted under 35 U.S.C. 154(b) by 468 days.

(21) Appl. No.: 12/830,777

(22) Filed: Jul. 6, 2010

(65) Prior Publication Data

US 2011/0026002 A1    Feb. 3, 2011

Related U.S. Application Data

(60) Provisional application No. 61/213,714, filed on Jul. 7, 2009, provisional application No. 61/258,743, filed on Nov. 6, 2009.

(51) Int. Cl.
| | | |
|---|---|---|
| G03B 27/54 | (2006.01) | |
| G03B 27/72 | (2006.01) | |
| G03B 27/68 | (2006.01) | |
| G03B 27/42 | (2006.01) | |
| G03B 27/32 | (2006.01) | |

(52) U.S. Cl.
USPC ............... 355/67; 355/52; 355/53; 355/71; 355/77

(58) Field of Classification Search
USPC ............ 355/52, 53, 55, 67–71, 77; 250/365, 250/492.1, 492.2, 492.22, 493.1, 548, 504 R
See application file for complete search history.

(56) References Cited

U.S. PATENT DOCUMENTS

| | | | | |
|---|---|---|---|---|
| 6,031,241 | A * | 2/2000 | Silfvast et al. | 250/504 R |
| 6,049,558 | A * | 4/2000 | Harada et al. | 372/107 |
| 6,469,827 | B1 * | 10/2002 | Sweatt et al. | 359/351 |
| 6,972,421 | B2 * | 12/2005 | Melnychuk et al. | 250/504 R |
| 7,088,424 | B2 * | 8/2006 | Bakker et al. | 355/53 |
| 2004/0179179 | A1 * | 9/2004 | Terashima | 355/53 |
| 2006/0012761 | A1 * | 1/2006 | Bakker et al. | 355/30 |
| 2006/0131515 | A1 * | 6/2006 | Partlo et al. | 250/504 R |
| 2006/0175558 | A1 * | 8/2006 | Bakker et al. | 250/492.2 |
| 2006/0289806 | A1 * | 12/2006 | Simmons et al. | 250/493.1 |
| 2008/0054189 | A1 * | 3/2008 | Moors et al. | 250/492.2 |
| 2008/0179548 | A1 * | 7/2008 | Bykanov et al. | 250/504 R |
| 2009/0087142 | A1 * | 4/2009 | Shibayama | 385/33 |
| 2009/0090877 | A1 * | 4/2009 | Van Empel et al. | 250/504 R |

* cited by examiner

Primary Examiner — Toan Ton
Assistant Examiner — Christina Riddle
(74) Attorney, Agent, or Firm — Pillsbury Winthrop Shaw Pittman LLP

(57) ABSTRACT

An EUV radiation generation apparatus includes an optical gain medium configured to produce laser radiation for interaction with a target material to produce an EUV radiation-emitting plasma, and a structure defining an aperture through which the laser radiation may pass. The structure includes a radiation guide having an outer surface constructed and arranged to guide the laser radiation away from the optical gain medium.

19 Claims, 3 Drawing Sheets

EUV RADIATION GENERATION APPARATUS

CROSS-REFERENCE TO RELATED APPLICATIONS

This application claims the benefit of priority from U.S. Provisional Patent Application Ser. Nos. 61/213,714, filed Jul. 7, 2009, and 61/258,743, filed Nov. 6, 2009, the entire contents of both of which are incorporated herein by reference.

FIELD

The present invention relates to an EUV radiation generation apparatus, and to a lithographic apparatus comprising an EUV radiation generation apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$, or by decreasing the value of $k_1$.

In order to shorten the exposure wavelength and, thus, reduce the minimum printable size, it has been proposed to use an extreme ultraviolet (EUV) radiation system. EUV radiation systems are configured to output a radiation wavelength of about 13 nm. Thus, EUV radiation systems may constitute a significant step toward achieving small features printing. Such radiation is termed extreme ultraviolet or soft x-ray, and possible systems include, for example, laser-produced plasma sources, discharge-produced plasma sources, or synchrotron radiation from electron storage rings.

A laser-produced plasma source, when in operation, converts a material into a plasma state that has an element, e.g. Xe, Li or Sn with one or more emission lines in the EUV range. The desired plasma can be produced by irradiating a target material, for example in the form of a droplet, stream or cluster of material, with a laser beam.

For this process, the plasma is typically produced in a sealed vessel, e.g., vacuum chamber, in this document also referred to as plasma chamber, and monitored using various types of metrology equipment. In addition to generating EUV radiation, these plasma processes also typically generate undesirable by-products in the plasma chamber which can include out-of-band radiation, high energy ions and debris, e.g., atoms and/or clumps/microdroplets of the target material.

As indicated above, one technique to produce EUV light involves irradiating a target material. In this regard, $CO_2$ lasers, e.g., outputting light at 10.6 μm wavelength, may present certain advantages as a drive laser irradiating the target material in a laser produced plasma (LPP) process. This may be especially true for certain target materials, e.g., materials containing tin. For example, one potential advantage may include the ability to produce a relatively high conversion efficiency between the drive laser input power and the output EUV power. Another potential advantage of $CO_2$ drive lasers may include the ability of the relatively long wavelength light (for example, as compared to deep UV at 198 nm) to reflect from relatively rough surfaces such as a reflective optic that has been coated with tin debris. This property of 10.6 μm radiation may allow reflective mirrors to be employed near the plasma for, for example, steering, focusing and/or adjusting the focal power of the drive laser beam.

It can be difficult to consistently and accurately hit a series of moving droplets with a pulsed laser beam. For example, some high-volume EUV light sources may call for the irradiation of droplets having a diameter of about 20-50 μm and moving at a velocity of about 50-100 m/s.

With the above in mind, systems and methods have been proposed for effectively delivering and focusing a laser beam to a selected location in an EUV light source.

An EUV light source has been proposed which comprises a target material located at a predetermined position, at least one optic establishing a beam path with the target material, and an optical gain medium positioned along the beam path. The optical gain medium is arranged to produce an amplified photon beam for interaction with the target material such that the target material produces an EUV light emitting plasma, without a seed laser providing output photons to the beam path. The optic may, for example, be a mirror. In operation, the optic and the target material may establish an oscillator cavity.

The optical gain medium may, however, also act as an amplifier in the absence of the line-emitting material at the predetermined position, which may hinder pumping of the optical gain medium.

SUMMARY

It is desirable to reduce radiation entering the beam path from a location other than the predetermined position, in order to avoid unwanted amplification of radiation in the optical gain medium in the absence of a target material at the predetermined position.

According to an aspect of the invention there is provided an EUV radiation generation apparatus comprising an optical gain medium, such as a $CO_2$ laser optical gain medium, configured to produce laser radiation for interaction with a target material to produce an EUV radiation-emitting plasma, and a structure defining an aperture through which the laser radiation may pass. The structure comprises a radiation guide having an outer surface constructed and arranged to guide the laser radiation away from the optical gain medium.

According to an aspect of the present invention, there is provided a lithographic apparatus that includes an EUV radiation generation apparatus that includes an optical gain medium configured to produce laser radiation for interaction with a target material to produce an EUV radiation-emitting plasma, and a structure that defines an aperture through which the laser radiation may pass, the structure comprising a radiation guide having an outer surface constructed and arranged to guide the laser radiation away from the optical gain medium. The lithographic apparatus also includes an illumination system configured to condition the EUV emitted by the plasma into a radiation beam, and a support structure constructed to hold a patterning device. The patterning device is capable of imparting the radiation beam with a pattern in its cross-section to form a patterned radiation beam. The lithographic apparatus also includes a substrate table constructed to hold a substrate, and a projection system configured to project the patterned radiation beam onto a target portion of the substrate.

According to an aspect of the present invention there is provided an assembly comprising an EUV radiation system comprising a source chamber, a target supply configured to supply a target material, an optic arranged to establish a beam path with a droplet of the target material when the droplet is located at a predetermined position, an optical gain medium, such as a $CO_2$ laser optical gain medium, positioned along the beam path and configured to produce laser radiation for interaction with the target material to produce an EUV radiation-emitting plasma inside the chamber, and a structure defining an aperture through which the laser radiation may pass. The structure includes a radiation guide having an outer surface constructed and arranged to guide the laser radiation away from the beam path. The assembly includes an illumination system configured to condition the EUV radiation emitted by the plasma.

According to an aspect of the present invention, there is provided a lithographic apparatus comprising an EUV radiation system comprising a source chamber, a target supply configured to supply a target material, an optic arranged to establish a beam path with a droplet of the target material when the droplet is located at a predetermined position, an optical gain medium positioned along the beam path and configured to produce laser radiation for interaction with the target material to produce an EUV radiation-emitting plasma inside the chamber, and a structure defining an aperture through which the laser radiation may pass. The structure includes a radiation guide having an outer surface constructed and arranged to guide the laser radiation away from the beam path. The lithographic apparatus includes an illumination system configured to condition the EUV radiation emitted by the plasma into a radiation beam, a support structure constructed to hold a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
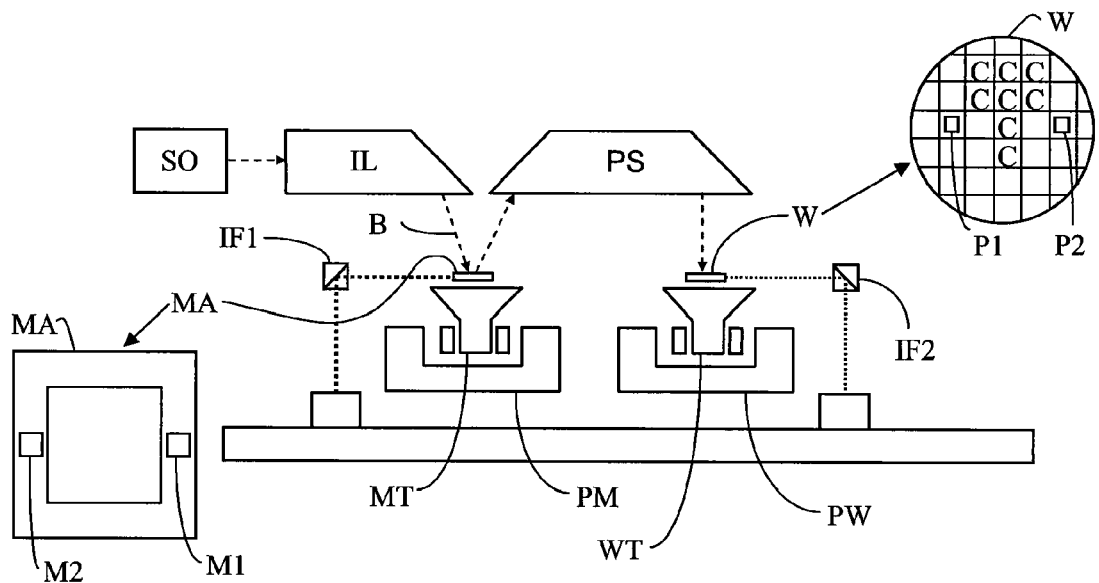
FIG. 1 depicts a lithographic apparatus according to an embodiment of the invention.

FIG. 1 schematically depicts a lithographic apparatus according to an embodiment of the invention. The apparatus comprises an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
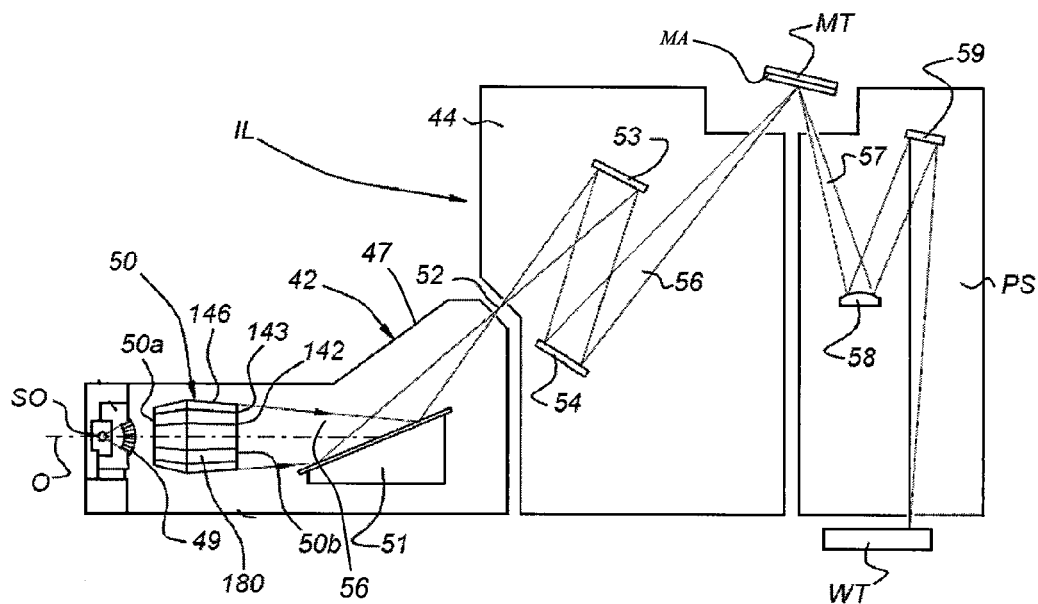
FIG. 2 depicts a more detailed schematic view of an embodiment of the lithographic apparatus of FIG. 1.

FIG. 2 shows an embodiment of the lithographic apparatus in more detail, including a radiation system 42, the illumination system IL, and the projection system PS. The radiation system 42 includes the radiation source SO which may be formed from a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. In an embodiment, Sn is used to create the EUV radiation emitting plasma.

The radiation emitted by radiation source SO passes via an optional gas barrier or contaminant trap 49 (in some cases also referred to as contaminant barrier or foil trap). The contaminant trap 49 may include a channel structure. The contaminant trap 49 may also include a gas barrier or a combination of a gas barrier and a channel structure.

The radiation system 42 includes a source chamber 47 within which a radiation collector 50 may be provided. The radiation collector 50 may be a grazing incidence collector. The radiation collector 50 has an upstream radiation collector side 50a and a downstream radiation collector side 50b. Radiation which is collected by the radiation collector 50 is focused as a radiation beam 56 with an intermediate focus point 52 at an aperture in the source chamber 47. The radiation beam 56 may be reflected from a grating spectral filter 51 prior to arriving at the intermediate focus point 52.

The radiation beam 56 emanating from source chamber 47 traverses the illumination system IL via so-called normal incidence reflectors 53, 54, as indicated in FIG. 2. The normal incidence reflectors direct the beam 56 onto a patterning device (e.g. reticle or mask) positioned on a support (e.g. reticle or mask table) MT. A patterned beam 57 is formed, which is imaged by projection system PS via reflective elements 58, 59 onto a substrate carried by wafer stage or substrate table WT. More elements than shown may generally be present in illumination system IL and projection system PS.

Grating spectral filter 51 may optionally be present, depending upon the type of lithographic apparatus. Instead of a reflective grating spectral filter, a transmissive filter may be used (not shown in the Figures). Such a filter may be located near to the intermediate focus point 52. Avoiding use of the reflective spectral grating filter 51 allows for a lower position of the radiation source SO. Optical filters transmissive for EUV and less transmissive for or even substantially absorbing UV radiation are known in the art. Hence, "grating spectral purity filter" is herein further indicated as "spectral purity filter" which includes gratings or transmissive filters. Not depicted in schematic FIG. 2, but also included as optional optical element may be EUV transmissive optical filters, for instance arranged upstream of collector mirror 50, or optical EUV transmissive filters in illumination system IL and/or projection system PS.

There may be more mirrors present than those shown in FIG. 2. For example, there may be one, two, three, four or even more reflective elements present in the projection system PS.

The radiation collector 50 may be similar to radiation collectors known from the prior art. The radiation collector 50, is described herein as a nested collector with reflectors 142, 143, and 146. The nested radiation collector 50, as schematically depicted in FIG. 2, is herein further used as an example of a grazing incidence collector (or grazing incidence collector mirror). However, instead of a radiation collector 50 including a grazing incidence mirror, a radiation collector including a normal incidence collector may be applied. Hence, where applicable, collector mirror 50 as grazing incidence collector may also be interpreted as collector in general.

The radiation collector 50 is usually placed in the vicinity of the source SO or an image of the source SO. Each reflector 142, 143, 146 may include at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146. For example, a further feature may be a protective holder, or a heater. Reference number 180 indicates a space between two reflectors, e.g. between reflectors 142 and 143. Each reflector 142, 143, 146 may include at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, such as for example a protective holder or a heater.

During use, on one or more of the outer reflectors 146 and inner reflectors 142 and 143 deposition may be found. The radiation collector 50 may be deteriorated by such deposition (deterioration by debris, e.g. ions, electrons, clusters, droplets, electrode corrosion from the source SO). Deposition of Sn, for example due to a Sn source, may, after a few monolayers, be detrimental to reflection of the radiation collector 50 or other optical elements, which may necessitate the cleaning of such optical elements.

Figures 3, 4:
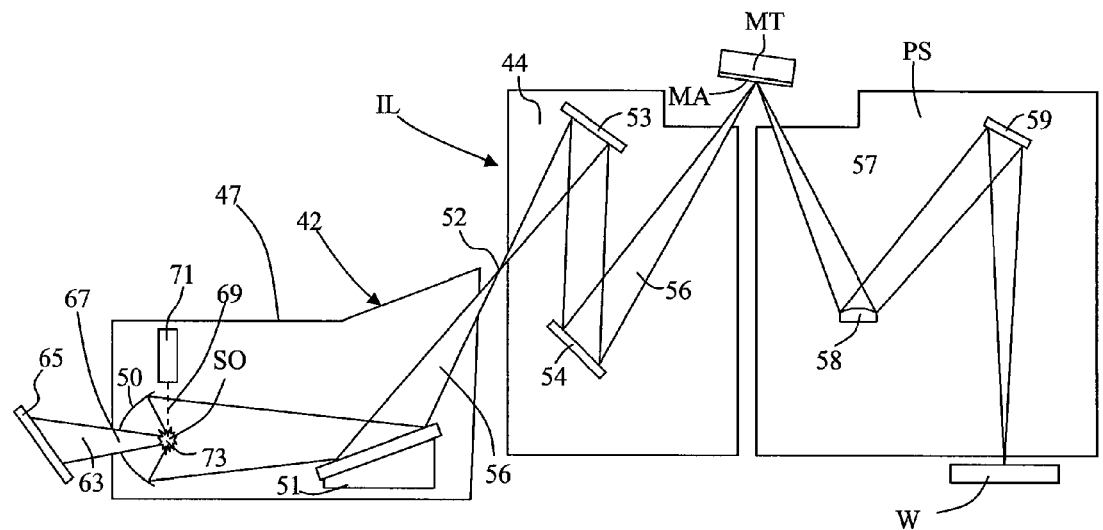
FIG. 3 depicts a more detailed schematic view of an embodiment of the lithographic apparatus of FIG. 1.
FIG. 4 depicts a detailed schematic view of an embodiment of a laser system of the lithographic apparatus of FIG. 3.

FIG. 3 shows another embodiment of the projection apparatus in detail. The illumination system IL and the projection system PS are very similar to the illumination system IL and the projection system PS of the projection apparatus of FIG. 2. However, the radiation system 42 uses a laser-produced plasma as a radiation source SO. The radiation system comprises a source chamber 47, in this embodiment not only substantially enclosing the source SO, but also the collector mirror 50 which, in the embodiment of FIG. 3, is a normal-incidence collector 50, for instance a multi-layer mirror.

The radiation system 42 is provided with a laser system (not shown in FIG. 3), which is constructed and arranged to provide a laser beam 63. The laser beam 63 is reflected by a mirror 65 (or other optics) through an aperture 67 provided in the collector mirror 50. The radiation system 42 further comprises a target material 69, such as Sn or Xe, which is supplied by a target material supply 71. The mirror 65 is arranged to establish a beam path for the laser beam 63 which intersects with a droplet of the target material 69, when the droplet of target material is located at a predetermined position 73.

In operation, the target material 69 is supplied by the target material supply 71 in the form of droplets. When such a droplet of target material 69 reaches the predetermined position 73, the droplet acts as a mirror which causes laser radiation to be emitted by a laser system. The laser radiation vaporizes the droplet of target material, and generates an EUV radiation-emitting plasma forms inside the source chamber 47. EUV radiation emitted from the predetermined position 73 is focused by the normal-incidence collector mirror 50 to form an EUV radiation beam 56 which has an intermediate focus point 52. The EUV radiation beam may pass via a reflective spectral grating filter 51 (or some other filter).

In FIG. 4, the laser system of the radiation system 42 of FIG. 3 is schematically depicted. The laser system 61 of FIG. 4 comprises an amplifier 75 having three amplifier chambers 77, 79, 81. The amplifier chambers 77, 79, 81 may each be provided with an optical gain medium positioned along a beam path 83. The laser system 61 further comprises a mirror 85 (or other reflective optic) constructed and arranged to reflect radiation which leaves the first amplifier chamber 77 back into the amplifier chamber (thereby establishing the beam path 83). The mirror 85 may for example be a flat mirror, curved mirror, phase-conjugate mirror or corner reflector. The mirror 85 may be wavelength selective. Also shown in FIG. 4 is the mirror 65 which is arranged to direct the beam path 83 such that it intersects with the droplet of the target material (not shown in FIG. 4) when the droplet of target material is located at the predetermined position. Since the laser system 42 is triggered by a droplet of target material, it does not need a seed laser.

The laser system 61 may for example comprise a $CO_2$ laser. Where this is the case, the optical gain medium provided in the amplifier chambers 77, 79, 81 may be $CO_2$ gas. Other gases may also be provided within the amplifier chambers. The laser system 61 may comprise a pulsed laser. The laser system 61 may for example generate infrared radiation, which may for example have a wavelength of 10.6 microns, or a wavelength of 1.06 microns.

A droplet of target material 69 (see FIG. 3) triggers operation of the laser system 61. When the droplet of target material 69 reaches the predetermined position 73, photons which are spontaneously emitted from optical gain media in the amplifier chambers 77, 79, 81 may be scattered by the droplet. Some scattered photons may travel along the beam path 83, such that they pass through the amplifier 75. The optical gain media in the amplifier chambers 77, 79, 81 is stimulated by these photons to emit additional photons, thereby forming a laser beam. The laser beam is reflected by the mirror 85 back through the amplifier chambers 77, 79, 81, thereby increasing the power of the laser beam.

Referring again to FIG. 3, the laser beam 63 is incident upon the droplet of target material 69, and causes the target material to vaporize. The target material is thus converted into a plasma which emits EUV radiation.

The laser beam 63 may for example have a wavelength between about 9.4 μm and about 10.6 μm. The wavelength may for example be about 10.6 µm. Laser radiation of about 10.6 µm is effective in vaporizing target material droplets to produce a plasma.

Figure 5:
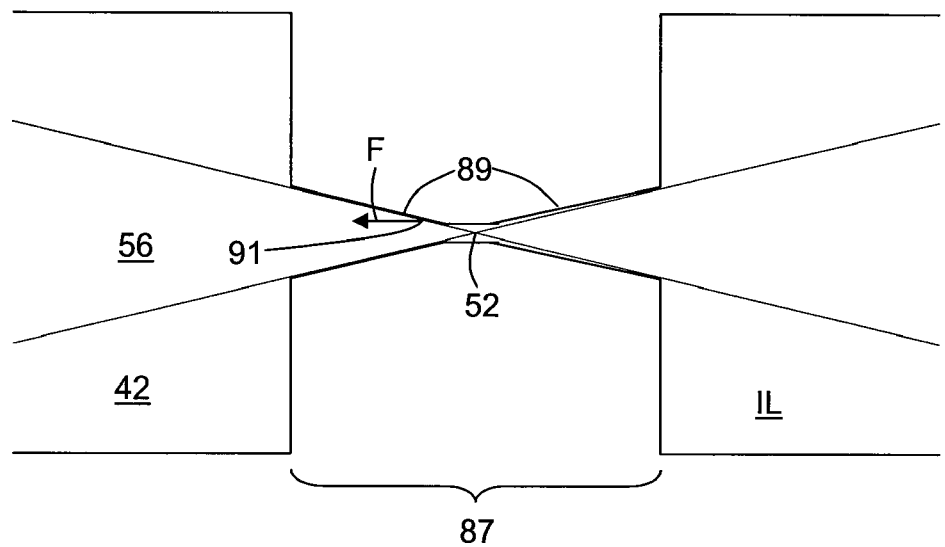
FIG. 5 depicts a detailed schematic view of a prior art embodiment of an interface between an EUV radiation system and an illuminator.

As illustrated in FIG. 5, an interface 87 between the radiation system 42 and the illuminator IL may for example be substantially shaped as a double cone 89. The EUV radiation beam 56 passes through the double cone 89, which is dimensioned such that it accommodates the EUV radiation beam. The intermediate focus point 52 of the EUV radiation beam 56 is located at the centre of the double cone 89. The double cone 89 acts as an aperture which ensures that only focused EUV radiation enters the illumination system.

In addition to the EUV radiation beam, a proportion of the laser beam 63 (see FIG. 3) may also pass into the double cone 89. There may be a significant possibility that photons of the laser beam will scatter from a surface of the double cone 89 (indicated by arrow F) and pass back into the amplifier 75 (see FIG. 4). If this were to happen, then the photons may trigger operation of the laser system 61 in the manner described above, but without a droplet of target material being present. This may hinder pumping of the optical gain media in the amplifier chambers 77, 79, and 81 (the gain media will be depleted by the premature triggering of the laser system), thereby reducing the intensity of the laser beam 63 when it is next incident upon a droplet of target material. In some instances an oscillator cavity may be formed, thereby effectively obstructing any pumping of the optical gain media altogether.

A potential problem which may arise is that the double cone 89 may be damaged by the laser beam (the power of the laser may be extremely high).

The double cone 89 is merely an example of an aperture structure which may give rise to unwanted triggering of the laser system 61. Other aperture structures, such as for example a conventional annular aperture structure, may also give rise to unwanted triggering of the laser system 61.

Figure 6:
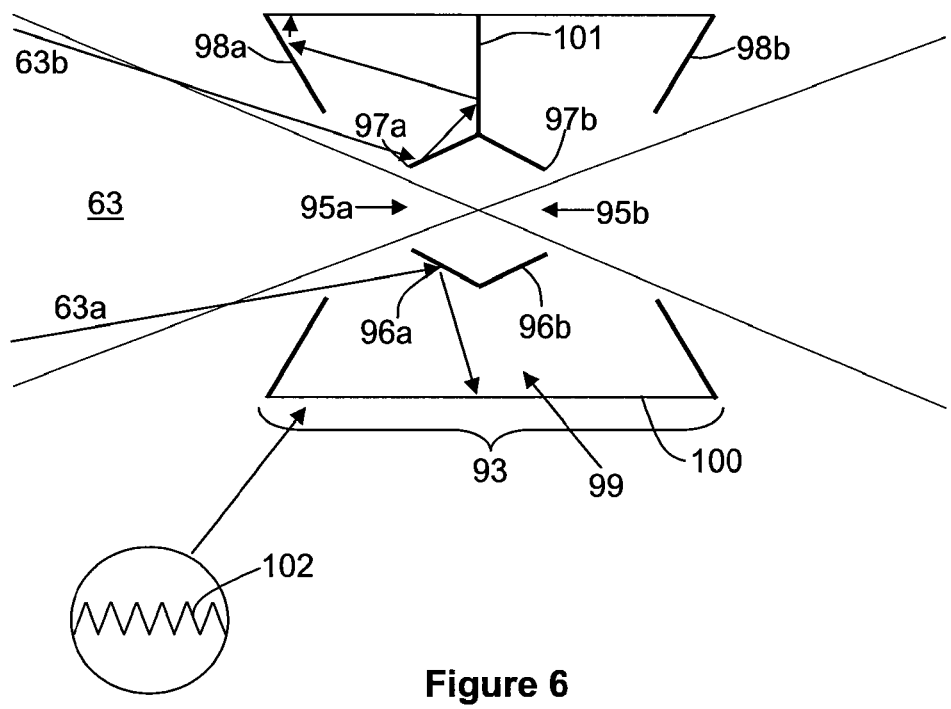
FIG. 6 depicts a detailed schematic view of an embodiment of a structure according to an embodiment of the invention.

In order to reduce the likelihood that photons will scatter from the aperture back into the amplifier 75, a structure is provided which defines the aperture and which further comprises a radiation guide constructed and arranged to guide radiation to a location that is away from the beam path. An example of such a structure 93 is shown in FIG. 6. The structure 93 may be provided at the interface 87 between the radiation system 42 and the illuminator IL. The structure 93 may for example be provided instead of the double cone 89, or may be provided instead of some other aperture.

As is illustrated in FIG. 6, the double cone surfaces from which photons may scatter back into the amplifier 75 are not present. Instead, apertures 95a, 95b are defined by two frustoconical structures 96a, 96b (referred to hereafter as frustoconical aperture structures 96a, 96b) which are connected to one another at their respective bases. An outer edge of each frustoconical aperture structure 96a, 96b defines each aperture 95a, 95b. Each outer edge may comprise a sharp edge 97a, 97b (which may be referred to as a razor edge). The sharp edge 97a, 97b reduces the amount of scattering of photons from the outer edges of the frustoconical aperture structures (compared with the amount of scattering that would be seen if the outer edges were not sharp).

Laser radiation which does not pass through the apertures 95a, 95b may instead be incident upon an outer surface of the first frustoconical aperture structure 96a. The outer surface of the first frustoconical aperture structure 96a is reflective, and the laser radiation is thus reflected from the frustoconical aperture structure. The first frustoconical aperture structure 96a has an angle of taper which is arranged such that the laser radiation is not reflected back towards the amplifier 75, but is instead reflected towards a radiation absorbing surface 100 (or towards some other location within an inside portion 99 of the structure). The reflective surface of the first frustoconical aperture structure 96a may be smooth, such that diffuse reflection from the reflective surface is avoided.

An example of reflection of the laser radiation from the outer surface of the first frustoconical aperture structure 96a is shown in FIG. 6. Laser radiation 63a is reflected from the outer surface of the first frustoconical aperture structure 96a towards a radiation absorbing surface 100. The laser radiation is absorbed by the radiation absorbing surface 100, thereby preventing the laser radiation from being reflected back towards the amplifier 75. In addition to absorbing photons, the structure may have the effect that particles are guided away, particles that may otherwise pass the intermediate focus.

The apertures 95a, 95b defined by the frustoconical aperture structures 96a, 96b may for example have a diameter of a few millimeters (e.g. 4 or more millimeters, e.g. up to 10 millimeters).

The structure 93 further comprises screens 98a, 98b which are frustoconical in shape (referred to hereafter as frustoconical screening structures 98a, 98b). Each frustoconical screening structure 98a, 98b is configured to screen from the amplifier 75 laser radiation which has been reflected from the frustoconical aperture structures 96a, 96b. The frustoconical screening structures 98a, 98b face inwardly (i.e. they taper towards the frustoconical aperture structures 95a, 95b). The frustoconical screening structures 98a, 98b may be oriented such that they reflect laser radiation towards the radiation absorbing surface 100.

An example of how the frustoconical screening structures 98a, 98b may work is shown in FIG. 6. Laser radiation 63b is reflected from the outer surface of the first frustoconical aperture structure 96a towards a support 101 which holds the frustoconical aperture structures 96a, 96b in place. The laser radiation 63b is reflected from the support 101 towards a frustoconical screening structure 98a. The laser radiation 63b is reflected from the frustoconical screening structure 98a towards the radiation absorbing surface 100, where it is absorbed. This prevents the laser radiation 63b from being reflected back towards the amplifier 75.

In an alternative embodiment, the frustoconical screening structure 98a is absorptive rather than reflective, and hence absorbs the laser radiation 63b rather than reflecting it. In some instances, the frustoconical screening structure 98a may be partially absorptive, such that it absorbs part of the laser radiation 63b and reflects the remainder.

The structure 93 may include additional structures (not illustrated). The additional structures may be configured to assist in absorbing laser radiation and/or directing laser radiation towards the radiation absorbing surface 100. The additional structures may for example be reflective structures or absorptive structures, some of which may be connected to one another. The additional structures may provide a 'labyrinth' of cavities, each of which absorbs a part of the laser radiation and/or guides it further into the structure 93.

The radiation absorbing surface 100 may for example be cylindrical in cross-section, rectangular in cross-section, or may have any other suitable shape.

The structure 93 may be configured such that laser radiation which does not pass through the apertures 95a, 95b enters an inside portion 99 of the structure 93, and is guided away from the amplifier 75. This reduces significantly the likelihood that laser radiation may be scattered from the structure 93 into the amplifier 75, and thus reduces the likelihood that pumping of the optical gain media of the amplifier is hindered. The term 'inside portion' may be considered to mean a volume which is entered by passing between an outer edge of the frustoconical screening structure 98a and an outer edge 97a of an adjacent frustoconical aperture structure 96a.

The frustoconical aperture structures 96a, 96b may be formed from a material which is reflective and has a high melting point (i.e. high enough that the material does not melt during operation of the lithographic apparatus). The frustoconical aperture structures 96a, 96b may be formed from molybdenum, tungsten, or any other suitable material.

At least a portion of the structure 93 may be formed from a ceramic material. For example, the screening structures 98a, 98b may be formed from a ceramic material or may be provided with a surface formed from ceramic material. The radiation absorbing surface 100 may be formed from a ceramic material or may be provided with a surface formed from ceramic material.

In some instances, the structure 93 may be cooled using water cooling (or other forms of cooling). If the structure 93 includes ceramic material, then this may for example reduce the need for water cooling of the structure.

At least a portion of the structure 93 may be formed from quartz, or any other material which is absorptive to the laser beam (for example, other suitable non-conductive materials).

The radiation absorbing surface 100 may include a surface structure which is configured to assist the surface in absorbing laser radiation. For example, the radiation absorbing surface 100 may include a series of ridges 102 which are triangular in cross-section, as shown schematically in FIG. 6. The series of ridges may for example be arranged in a manner analogous to a screw-thread. The steepness of the ridges may be selected such that laser radiation which is incident upon a ridge is likely to be reflected towards a facing ridge. The radiation may for example then be reflected back towards the ridge upon which the radiation was originally incident, etc. In one example, more than 90% of the intensity of the radiation may be absorbed during each reflection, such that more than 99% of the radiation has been absorbed after two reflections. Thus, even if the radiation were to pass out of the radiation absorbing structure 100 after two reflections, it would have a significantly reduced intensity.

The radiation absorbing surface 100 may be provided with some other structure which is configured to assist the surface to absorb laser radiation.

Other components of the structure 93 may include a surface structure which is configured to assist the surface to absorb laser radiation.

Although frustoconical aperture structures 96a, 96b are used to form the apertures 95a, 95b, structures having other shapes may be used (e.g. other tapered structures). The structures may be configured such that laser radiation which is reflected from the structures is either directed towards a radiation absorbing surface or towards a reflective surface which will direct the laser radiation towards a radiation absorbing surface (this may be via one or more additional reflective surfaces). The structures may be tapered Although the screens 98a, 98b are formed from frustoconical screening structures 98a, 98b, structures having other shapes may be used to form the screens. The structures may be configured such that laser radiation which is reflected from them is retained within the inside portion 99 of the structure 93. The structures may be angled towards the frustoconical aperture structures 96a, 96b. In this context the term 'angled towards' is not intended to mean that the structures must point directly at the frustoconical aperture structures 96a, 96b, but instead is intended to mean that the structures point in the general direction of the frustoconical aperture structures 96a, 96b rather than pointing away from them.

Although screens 98a, 98b are shown on both sides of the structure 93, in some instances the screen which is furthest from the amplifier 75 may be omitted. Where this is the case, laser radiation may leak into the illuminator IL.

In the above description, the term 'laser radiation' has been used. This may be interpreted as including radiation emitted from the laser system 61 when the laser system 61 is not oscillating but is nevertheless emitting radiation.

The structure 93 may provide the advantage that it is less susceptible to damage (e.g. due to overheating) in the presence of the EUV radiation beam 56 than a conventional aperture. The structure 93 may thus be of use in a lithographic apparatus having a source as described further above in relation to FIG. 2.

The above description relates to providing the structure 93 at an intermediate focus of an EUV lithography apparatus. However, the structure 93 may be provided in other suitable locations. For example, the structure 93 may be provided at a suitable location within the laser system 61 (e.g. at a beam waist or focus of the laser beam). Where this is done, the apertures 95a, 95b defined by the frustoconical aperture structures 96a, 96b may for example have a diameter of a few millimeters (e.g. 1 or more millimeters).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:
1. An EUV radiation generation apparatus comprising:
an optical gain medium configured to produce laser radiation for interaction with a target material to produce an EUV radiation-emitting plasma; and
a structure that defines an aperture through which the laser radiation may pass, the structure comprising a radiation guide having an outer surface constructed and arranged to guide the laser radiation away from the optical gain medium, wherein the outer surface of the structure is configured such that the laser radiation that does not pass through the aperture is either directed towards a radiation absorbing surface or towards a reflective surface that directs the laser radiation towards the radiation absorbing surface.

2. The apparatus of claim 1, wherein the outer surface of the structure is tapered.

3. The apparatus of claim 2, wherein the tapered outer surface has an angle of taper arranged such that the tapered outer surface does not reflect laser radiation back towards the optical gain medium.

4. The apparatus of claim 2, wherein the tapered outer surface has an angle of taper arranged such that the laser radiation is reflected towards a radiation absorbing surface.

5. The apparatus of claim 1, wherein the structure comprises two frustoconical structures connected to one another at their respective bases.

6. The apparatus of claim 1, wherein the structure has one or more sharp outer edges.

7. The apparatus of claim 1, wherein the structure further comprises one or more screens.

8. The apparatus of claim 7, wherein the one or more screens are oriented such that the one or more screens reflect laser radiation towards a radiation absorbing surface.

9. The apparatus of claim 7, wherein the one or more screens are inwardly facing frustoconical structures.

10. The apparatus of claim 7, wherein the one or more screens are configured such that the laser radiation that is reflected from the one or more screens is retained within an inside portion of the radiation guide.

11. The apparatus of claim 7, wherein the one or more screens have radiation absorbing surfaces.

12. The apparatus of claim 1, wherein the structure includes a radiation absorbing surface having a surface structure configured to assist the surface in absorbing laser radiation.

13. The apparatus of claim 12, wherein the surface structure comprises a series of ridges that are triangular in cross-section.

14. The apparatus of claim 1, wherein at least a portion of the structure is formed from a ceramic material.

15. The apparatus of claim 1, wherein the aperture is located at an intermediate focus of the apparatus.

16. The apparatus of claim 1, wherein the aperture is located at a beam waist or focus of the laser radiation generated by the optical gain medium.

17. A lithographic apparatus comprising:
the EUV radiation generation apparatus of claim 1;
an illumination system configured to condition the EUV radiation emitted by the plasma into a radiation beam;
a support structure constructed to hold a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

18. An assembly comprising:
an EUV radiation system comprising
a source chamber,
a target supply configured to supply a target material,
an optic arranged to establish a beam path with a droplet of the target material when the droplet is located at a predetermined position,
an optical gain medium positioned along the beam path and configured to produce laser radiation for interaction with the target material to produce an EUV radiation-emitting plasma inside the chamber,
a structure defining an aperture through which the laser radiation may pass, the structure comprising a radiation guide having an outer surface constructed and arranged to guide the laser radiation away from the beam path, wherein the outer surface of the structure is configured such that the laser radiation that does not pass through the aperture is either directed towards a radiation absorbing surface or towards a reflective surface that directs the laser radiation towards the radiation absorbing surface, and
an illumination system configured to condition the EUV radiation emitted by the plasma.

19. A lithographic apparatus comprising:
an EUV radiation system comprising
a source chamber,
a target supply configured to supply a target material,
an optic arranged to establish a beam path with a droplet of the target material when the droplet is located at a predetermined position,
an optical gain medium positioned along the beam path and configured to produce laser radiation for interaction with the target material to produce an EUV radiation-emitting plasma inside the chamber, and
a structure defining an aperture through which the laser radiation may pass, the structure comprising a radiation guide having an outer surface constructed and arranged to guide the laser radiation away from the beam path, wherein the outer surface of the structure is configured such that the laser radiation that does not pass through the aperture is either directed towards a radiation absorbing surface or towards a reflective surface that directs the laser radiation towards the radiation absorbing surface, and
an illumination system configured to condition the EUV radiation emitted by the plasma into a radiation beam;
a support structure constructed to hold a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

* * * * *